United States Patent [19]

Volkmann

[11] 4,177,499
[45] Dec. 4, 1979

[54] ELECTRONIC ASSEMBLY WITH HEAT SINK MEANS

[75] Inventor: Werner K. Volkmann, Media, Pa.

[73] Assignee: Volkmann Electric Drives Corporation, Folcroft, Pa.

[21] Appl. No.: 850,911

[22] Filed: Nov. 14, 1977

[51] Int. Cl.² ............................................. H05K 7/20
[52] U.S. Cl. .................................... 361/388; 361/386; 361/383
[58] Field of Search ................... 174/16 HS; 361/383, 361/384, 386, 388, 387, 395

[56] References Cited

U.S. PATENT DOCUMENTS

| | | | |
|---|---|---|---|
| 3,518,493 | 6/1970 | Bathrick, Jr. | 361/388 |
| 3,780,798 | 12/1973 | Reimer | 361/383 |
| 3,940,665 | 2/1976 | Seki | 361/383 |
| 4,006,388 | 2/1977 | Bartholomew | 361/383 |
| 4,027,206 | 5/1977 | Lee | 361/384 |

Primary Examiner—Gerald P. Tolin
Attorney, Agent, or Firm—Eugene E. Renz, Jr.

[57] ABSTRACT

An electronic assembly consisting of at least a pair of modules, a control and power semiconductor module and a filter module interconnected by means permitting ease of assembly and disassembly. The control and power semiconductor module comprises a pair of spaced heat sinks forming side enclosures for the assembly and connected by bracket means to a printed circuit board (PCB) which mounts electronic components on its upper face including high heat generating elements carried by the bracket means. The PCB is located at one end of the heat sinks which is secured at their other end to the base of the filter module. The large capacitors and reactors supported on the base nest in the chamber or cavity formed by the PCB and heat sinks to provide a compact assembly.

5 Claims, 5 Drawing Figures

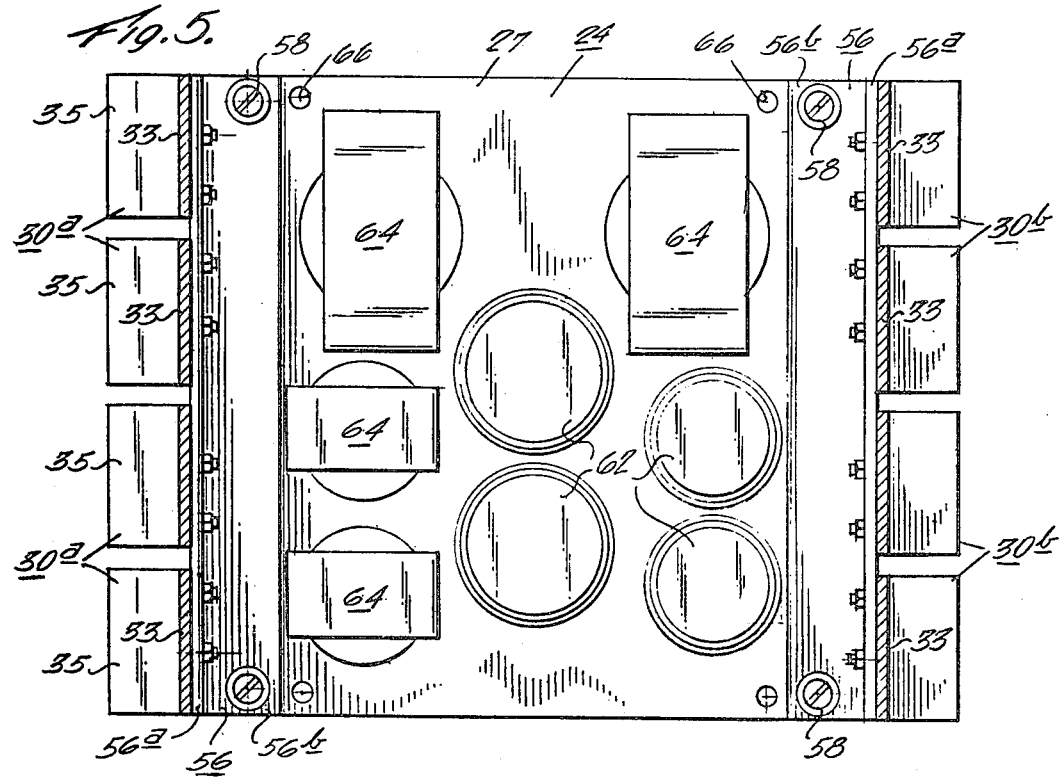
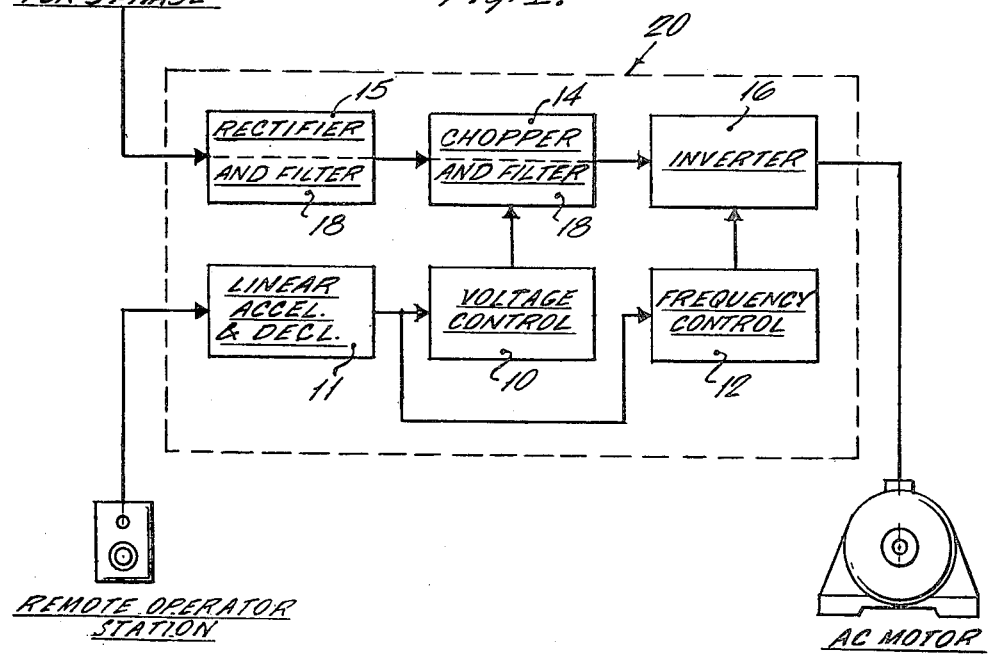

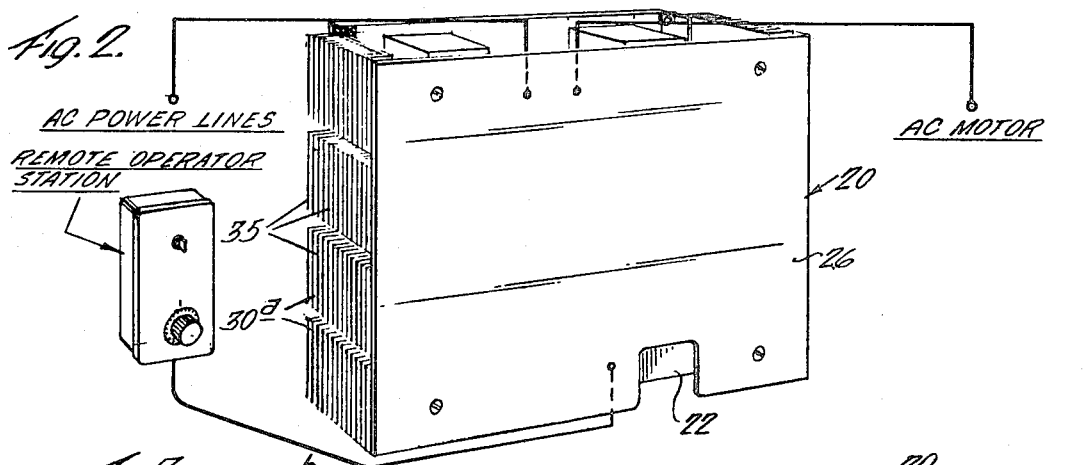
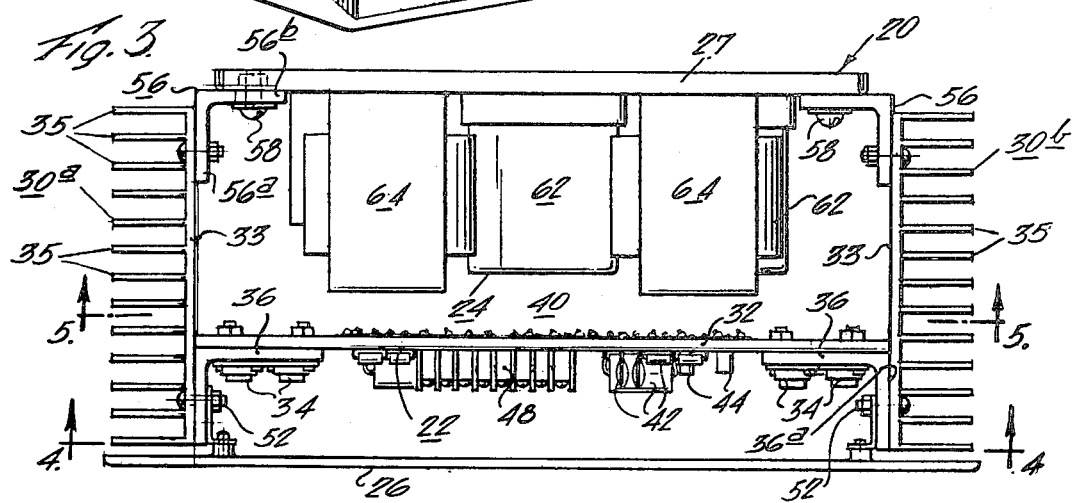
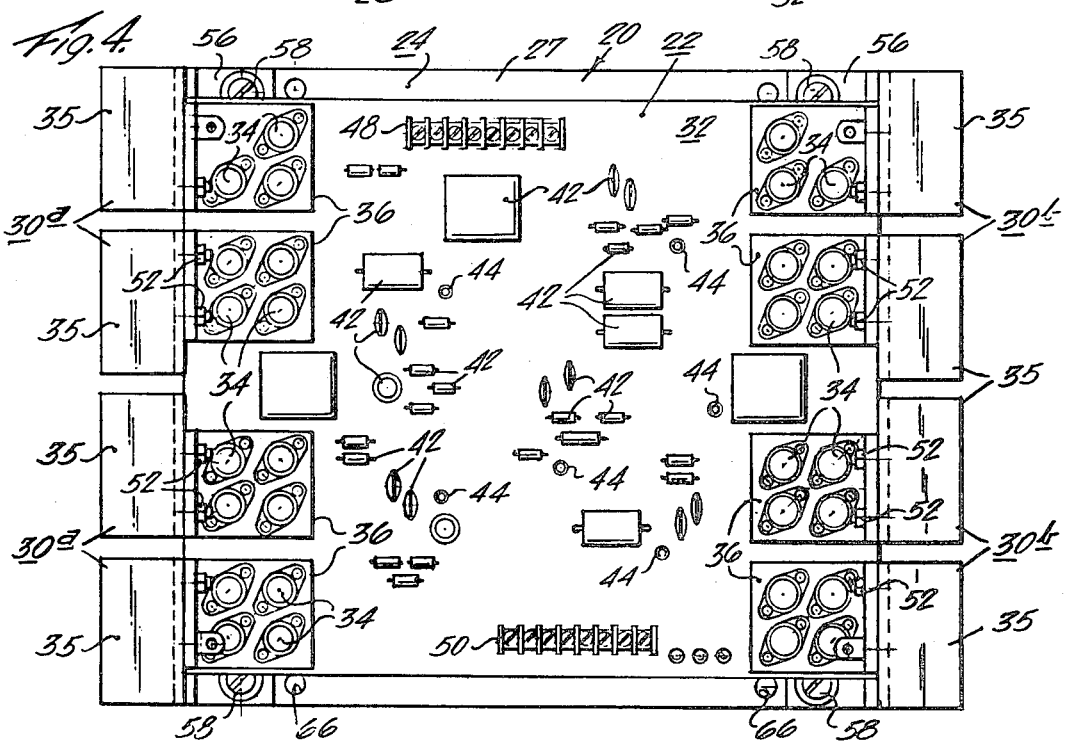

ELECTRONIC ASSEMBLY WITH HEAT SINK MEANS

The present invention relates to packaging of electronic assemblies and more specifically to a controller for varying AC motor speeds wherein functionally dependent elements are grouped into modular sub-assemblies and integrated with heat dissipating means to form a single, integral assembly thereby reducing manufacturing, assembly, maintenance and repair costs.

BACKGROUND OF THE INVENTION

Even though the principles of the present invention apply to various types of electronic assemblies, the novel features of the present invention, both as to organization, content and function, are best understood and appreciated by reference to an electronic controller for variable speed operation of polyphase AC motors. Before describing the controller assembly of the present invention in detail, it will be helpful to understand its function, circuit elements and current packaging techniques.

It is known that variable AC motor speeds are achieved by varying the frequency and voltage supply to the motor. Means, therefore, must be provided to continually generate frequencies and voltages consistent with the desired speed of the motor. FIG. 1 illustrates a typical controller block diagram consisting of solid-state electronic control circuits 10, 11 and 12 and power semiconductors 14, 15 and 16 generally consisting of diodes, switching transistors, thyristors, resistors, and capacitors as well as filter elements 18 consisting of large capacitors and inductors.

Typically in these circuits, all circuit elements are functionally interdependent, but because of their physical incompatibility, both as to size and heat dissipation, current packaging techniques employ separately constructed mechanical entities for the electronic control, the power semiconductors and the filter elements. Additionally, power semiconductors such as power switching transistors and rectifiers which generate significant amounts of heat must be conductively and/or convectively cooled to maintain junction temperatures within specified limits for proper operation. Presently this necessitates mounting the power semiconductors directly on bulky metallic heat sinks, in most cases precluding their physical integration with control circuit elements on printed circuit cards and thereby resulting in complex interconnection wiring networks. The increased potential for failure resulting from complex wiring runs and extensive use of connectors means significant reduction in reliability.

SUMMARY OF THE INVENTION

Substantial reductions in manufacturing, maintenance and repairing costs may be realized by designing a controller assembly utilizing the principals and concepts of the present invention. Thus the controller of the present invention consists of two easily assembled and disassembled modules which comprise the entire controller package. One module consists of the control and power semiconductors which are integrated on a printed circuit board minimizing wiring interconnections and connectors and means for mounting the high heat producing power semiconductors in a predetermined manner relative to the heat sinks to produce good heat transfer and dissipation. The second module consists of large capacitors and inductors comprising the filter circuits which is of a predetermined, complementary construction in relation to the first module so that it nests into the control and power semiconductor module forming a compact package requiring minimal interconnection wiring between the two modules and permitting quick assembly and disassembly. This arrangement minimizes lead length of the power connections and therefore less electromagnetic interference problems which is an important consideration in fast switching power circuits. As explained in more detail hereafter, in the particular package configuration, the heat sinks provide the heat dissipating capacity and also are arranged to define structural side enclosures of the assembly. The printed circuit board also serves a similar dual function; a locus for the electronic elements and a structural element forming the top enclosure of the assembly.

With the above in mind it is an object of the present invention to provide a compact electronic assembly consisting of modularized sub-assemblies thereby reducing costly manufacture and inspection steps affecting parallel sub-assembly lines and minimizing final assembly and test times.

Another object of the present invention is to provide an electronic assembly utilizing printed circuit boards to take advantage of flow soldered connections thereby considerably reducing expensive hand wiring connections.

Still another object of the present invention is to provide an electronic package wherein the integration of power semiconductors with control circuits on a printed circuit board as well as the terminal boards further reduces hand wiring interconnections and the resultant high cost.

Still a further object of the present invention is to provide an electronic assembly constructed and arranged to provide ready access to all components for ease of repair and maintenance and facilitating orientation of diagnostic test points for ease of fault isolation.

Still another object of the present invention is to provide an assembly wherein the heat sink members are integrated with the enclosure structure in a predetermined manner to effectively cool the high heat dissipating elements.

Still another object of the present invention is to provide an assembly wherein the connections between fast switching power components are as short as possible so that voltage transients and oscillations are negligible.

A further object of the present invention is to provide an assembly which is readily integrated in existing cabinets or in separately mounted standard enclosure.

DESCRIPTION OF THE DRAWINGS

These and other objects of the present invention and the various features and details of the operation and construction of an electronic package assembly in accordance with the present invention are hereinafter more fully set forth with reference to the accompanying drawings, wherein;

FIG. 1 is a schematic of a typical controller block diagram;

FIG. 2 is a perspective view of the present invention for a controller for varying AC motor speeds;

FIG. 3 is a plan view of the controller shown in FIG. 2;

FIG. 4 is a sectional elevation taken on the line 4—4 of FIG. 3;

FIG. 5 is a sectional elevation taken on the line 5—5 of FIG. 3.

Referring now to the drawings and particularly to FIG. 3 thereof there is shown a controller constructed in accordance with the present invention generally designated by the numeral 20. The unit comprises two separately assembled modules, a control and power semiconductor module 22 and a filter module 24. The assembly further includes a front cover plate or panel 26 secured to the control and power semiconductor module by simple screw means to facilitate easy removal for access to the electronic components of the module. As illustrated the control and power semiconductor module 22 which is the outermost or top assembly is detachably secured by bracket and screw means to the base or mounting plate 27 of the filter module 24 to form a complete controller assembly. Further as illustrated, two banks of heat sinks $30^a$, $30^b$, on opposing sides of printed circuit board 32 (PCB) provide connecting means for the two modules through bracket mounts 36 and external cooling for the power semiconductors 34. The close proximity of the filter elements to the power semiconductor and control circuits is achieved by nesting them in the channel or cavity 40 formed by the particular mounting arrangement of the heat sinks and PCB. By this arrangement a single, compact package is formed which can be mounted in a variety of ways, for example (a) open panel mounted in an existing cabinet, (b) closed off with the panel cover 26, wall mounted and collocated with the motor and operator station; or (c) assembled in a standard NEMA enclosure.

The modular design of the present invention broadly stated achieves the following major objectives which will become more apparent in the following detailed description:

1. Integration of the control and power semiconductors as well as terminal boards on a single PCB;
2. Integration of heat dissipating module connecting members with the power semiconductors and also forming the structural exterior of the controller assembly;
3. Easy access to all circuits for maintenance and repair;
4. Less electromagnetic interference by reason of short power connections;
5. Ease of assembly; and
6. Easy access to AC line motor and operator station connections.

Considering now in more detail the specific structure of the modules 22 and 24 comprising the assembly and considering first the control and power semiconductor module 22, this module consists of the generally rectangular PCB 32 spanning spaced parallel banks of heat dissipating members $30^a$, $30^b$. Each bank consists of a plurality of sections in the illustrated embodiment four (4) sections which are arranged in a stack, each section having a planar end wall 33 and a plurality of fins 35. As illustrated the fins 35 are outwardly directed. However, other fin configurations are possible. Mounting brackets 36 connect the side edge of the PCB 32 to the opposing sections of each bank of heat sinks so that the PCB is slightly recessed. In the present instance the PCB 32 is oriented such that the surface area forms the uppermost shelf and with the cover 26 removed exposes all circuits for easy accessibility for maintenance and repair. The control, regulation and protection electronic parts 42 of the circuit and the diagnostic test points 44 providing status checking are mounted in the central portion of the PCB 32 and interconnected by conventional printed circuit means thus permitting the integration of power semiconductors 34 adjacent the opposing side edge portions of the PCB and in direct thermal connection via the bracket assemblies 36 to the heat dissipating banks $30^a$, $30^b$. By this arrangement electronic components and test points as well as indicator lights are front accessible simply by removing the front panel 26.

The PCB is of conventional single layer epoxy fiberglass construction. In package assemblies for other applications embodying the concepts of the present invention, the PCB may be multi-layered or single or multilayer arranged in a stack-up or employ different materials.

One of the features of the present invention is the mounting arrangement for the power semiconductors which as illustrated comprises the mounting brackets providing the means for thermally conductively coupling the power semiconductors to the heat dissipating module connecting members and also the means for mounting the power semiconductors to the PCB. More specifically as shown in FIG. 3, the mounting brackets comprise a series of four (4) L-shaped brackets 36 on opposite sides of the PCB. The brackets have large planar end wall 33 to provide good conduction of heat generated by the power semiconductors. As illustrated, one leg of the L-shaped mounting bracket 36 is attached to the flat surface of the end wall 33 by screw means and the other leg is similarly connected to the PCB. The cross sectional area of the L-shaped bracket is sized to permit sufficient heat flow to maintain the power semiconductor junction temperature within acceptable limits. The contact surface area between brackets and the heat dissipating connecting member is chosen to permit the required heat flow. Connections (not shown) for gating the power semiconductors from the control circuits are achieved by etched flow soldering. Also the power connections between the power semiconductors and to incoming and outgoing terminal board points are etched flow soldering connections.

In the present instance the adaptor brackets 36 are made of an aluminum alloy. In other applications, the shape may be varied to form a variety of configurations such as C, Z, or I cross sections. Interior cross sectional area and contact surface area may all be varied to give the desired temperature drop between the transistor junction and the heat dissipating members. Also thermal contact enhancement materials such as thermal grease may be used.

Another important feature of the present invention as noted previously is the dual function of the banks of heat dissipating mounting members. When assembled in the manner shown, they serve to conduct and dissipate heat away from the power semiconductors 34 and also form the side supporting members of the entire assembly. As shown in FIGS. 3 and 4, the heat dissipating members on opposing sides of the housing mate with the four (4) L-shaped mounting brackets 36 along the outward flat surface of one leg $36^a$ of the bracket and the planar surface 33 of the heat dissipating mounting member with the transversely projecting fins 35 forming the outer side surface of the housing and exposing the fins to the ambient air. The surface-to-surface contact thus formed is firmly secured by simple screw means 52 with sufficient pressure to assure adequate transfer of heat. The PCB 32 is mounted adjacent the upper end of the planar end wall 33 to form a rectangular cavity 40 beneath the PCB within which the filter elements protrude when the filter module 24 is assembled to the control and power semiconductor module 22. By this arrangement wiring connections between the control and power semiconductor module and the filter module were kept short and simple.

The heat dissipating connecting members are either die cast or of machined one-piece construction and may be made by conventional materials such as copper or aluminum.

As indicated previously, final assembly of the two modules to form the controller package is accomplished by attaching elongated connecting brackets 56 carried by the heat sinks at their lower end to the mounting plate 27 by single screw means 58 at each end of the connecting bracket 56. Referring again to FIGS. 3 and 5 the connecting bracket 56 is an L-shaped member, one leg 56$^a$ of which is pre-secured to the lower portion of the heat dissipating sections of each bank and the other leg 56$^b$ secures by means of a single screw or bolt 58 the mounting plate 27 of the filter module 24 to the control and power semiconductor module 22. It will be noted that the connecting brackets 56 protrude slightly beyond the upper and lower edges of the upper PCB shelf providing direct visual and physical access to the screw means 58 for final assembly of the two modules. In this manner, no special tools, access holes or prescribed disassembly and/or assembly procedures are required resulting in a highly simple final assembly process. In addition to providing the final assembly means, the connecting brackets 56 are constructed of high strength plastic material thereby providing electrical insulation between the upper and lower modules.

As illustrated by FIGS. 3 and 5, the filter module consists of the mounting plate 27 and the capacitor 62 and inductor 64 circuit elements. In accordance with the objectives and concepts of this invention, the large filter elements are grouped and secured within the central portion of the mounting plate 27 permitting the filter elements to protrude into the box-like cavity 40 formed by the heat dissipating members on the sides and the PCB shelf on top. As mentioned previously, the compact package formed in this manner greatly reduces harness runs from the filter elements to the PCB circuits thus improving reliability, reducing manufacturing costs and reducing electrical transients and oscillations. In this instance, the rectangular mounting plate 27 serves the dual purpose of providing a highly rigid mounting surface for the heavy and bulky filter elements and is also the base structure of the controller package. Wall mounting of the controller package can be achieved in a variety of ways. In this instance, mounting holes 66 are provided in the mounting plate and are offset positioned such that direct access is made possible with no disassembly required.

In summary, therefore, the present invention provides an electronic assembly where substantially all the control components are easily accessible from the front of the unit to facilitate checking and maintenance. Further accessibility to power components such as the filter elements is easily accomplished by simply removing the screw means mounting the control and power semiconductor module to the base of the filter module. The overall arrangement provides a simplified mechanical assembly by reason of being only one integrated unit rather than several separate mechanical assemblies. Fewer parts and less assembly time produce favorable manufacturing costs. Further the heat sinks serve the dual purpose of cooling and defining side enclosures for the assembly. Lastly the majority of all power connections are made on the PCB with etching runs; eliminating wire connections and connectors. This, of course, reduces assembly time. Furthermore, the operational reliability of the assembly is improved.

While a particular embodiment of the invention has been illustrated and described herein it is not intended to limit the invention and changes and modifications may be made therein within the scope of the following claims.

I claim:

1. An electronic assembly consisting of at least a pair of modules interconnected by means permitting ease of assembly and disassembly, one of said modules comprising a pair of spaced heat sinks, a printed circuit board mounted by first bracket support means between said heat sinks, electronic components on the upper face of said printed circuit board including high heat generating elements supported by said first bracket support means along side edges of said printed circuit board in close proximity to said heat sinks, the other module including a base underlying said printed circuit board and mounting electronic components on a face thereof and second bracket means carried by said heat sinks and secured to said base, said heat sinks thereby forming side enclosures for said assembly.

2. An electronic assembly as claimed in claim 1 wherein said second bracket support means includes a series of brackets, each comprising a strap of generally L-shaped cross section secured along the lower edge of said heat sinks and fastening means at the outer ends of said straps securing the first module to the base of said second module, said strap ends projecting slightly beyond the upper and lower edges of said printed circuit board to facilitate access to the fastening means.

3. An electronic assembly as claimed in claim 1 wherein each of said heat sinks comprises a plurality of sections each including a planar end wall confronting the printed circuit board for said bracket means.

4. An electronic assembly as claimed in claim 3 wherein said first bracket means comprises a series of brackets, said high heat generating electronic elements mounted on one leg of each of said brackets and the other in surface-to-surface contact with the planar surface of said heat sinks.

5. An electronic assembly as claimed in claim 1 wherein the printed circuit board is mounted adjacent one end of said heat sinks and the second module is secured adjacent the opposite end of said heat sinks, the arrangement providing a cavity defined by the lower face of the printed circuit board and the opposing heat sinks wherein electronic elements carried by said second module nest in said cavity.

* * * * *